US008456351B2

(12) United States Patent
Kam et al.

(10) Patent No.: US 8,456,351 B2
(45) Date of Patent: Jun. 4, 2013

(54) PHASED ARRAY MILLIMETER WAVE IMAGING TECHNIQUES

(75) Inventors: Dong G. Kam, White Plains, NY (US); Duixian Liu, Scarsdale, NY (US); Arun S. Natarajan, White Plains, NY (US); Scott K. Reynolds, Amawalk, NY (US); Alberto Valdes Garcia, Hartsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 12/897,964

(22) Filed: Oct. 5, 2010

(65) Prior Publication Data

US 2011/0254727 A1      Oct. 20, 2011

Related U.S. Application Data

(60) Provisional application No. 61/325,894, filed on Apr. 20, 2010.

(51) Int. Cl.
*G01S 13/89* (2006.01)
(52) U.S. Cl.
USPC .......................... 342/179; 342/175; 342/25 F
(58) Field of Classification Search
USPC ................. 342/179, 175, 25 A, 25 F
See application file for complete search history.

(56) References Cited

U.S. PATENT DOCUMENTS

| 4,676,623 A | | 6/1987 | Akashi et al. ............... 396/92 |
|---|---|---|---|
| 4,901,084 A | * | 2/1990 | Huguenin et al. ............ 342/179 |
| 4,910,523 A | * | 3/1990 | Huguenin et al. ............ 342/179 |
| 5,038,147 A | | 8/1991 | Cerro et al. .................. 342/368 |
| 5,202,692 A | | 4/1993 | Huguenin et al. ............ 342/179 |
| 5,237,334 A | | 8/1993 | Waters ......................... 343/753 |
| 5,455,590 A | * | 10/1995 | Collins et al. ................ 342/179 |
| 5,457,557 A | | 10/1995 | Zarem et al. ................. 398/116 |
| 6,323,804 B1 | | 11/2001 | Kurby et al. ............. 342/357.64 |
| 6,828,556 B2 | | 12/2004 | Pobanz et al. ............ 250/336.1 |
| 7,170,442 B2 | | 1/2007 | Lovberg et al. .............. 342/179 |
| 7,415,244 B2 | | 8/2008 | Kolinko et al. ................ 455/25 |
| 7,561,090 B1 | | 7/2009 | Muenter et al. .............. 341/155 |
| 7,570,221 B2 | | 8/2009 | May et al. ..................... 343/753 |
| 8,081,297 B2 | * | 12/2011 | Bridges et al. .............. 356/3.01 |
| 8,319,678 B2 | * | 11/2012 | Weiss ............................ 342/22 |
| 2002/0080361 A1 | * | 6/2002 | Bablumyan et al. ......... 356/450 |
| 2002/0085206 A1 | * | 7/2002 | Hait ............................. 356/450 |
| 2003/0122079 A1 | | 7/2003 | Pobanz et al. ............ 250/336.1 |
| 2004/0212358 A1 | | 10/2004 | Stephen et al. ............ 324/76.19 |
| 2005/0067576 A1 | | 3/2005 | Caria ...................... 250/370.08 |
| 2006/0279458 A1 | | 12/2006 | Mohamadi .................... 342/368 |

(Continued)

OTHER PUBLICATIONS

Blanchard et al., Coherent Optical Beam Forming with Passive Millimeter-Wave Arrays, Journal of Lightwave Technology, vol. 17, No. 3, Mar. 1999.

(Continued)

*Primary Examiner* — John B Sotomayor
(74) *Attorney, Agent, or Firm* — Ido Tuchman; Anne V. Dougherty

(57) ABSTRACT

An apparatus, imager elements, and a method for detecting a radio frequency image using phased array techniques. An example apparatus includes an array of radio frequency antennas fabricated on one or more packaged integrated circuits. The apparatus also includes a controller configured to selectively phase shift radio frequency signals from the antennas such that the at least a portion of the radio frequency image is focused.

18 Claims, 12 Drawing Sheets

U.S. PATENT DOCUMENTS

| | | | |
|---|---|---|---|
| 2008/0079652 A1 | 4/2008 | Mohamadi | 343/893 |
| 2009/0284405 A1 | 11/2009 | Salmon et al. | 342/22 |
| 2011/0254727 A1* | 10/2011 | Kam et al. | 342/179 |
| 2012/0076498 A1* | 3/2012 | Sayeed et al. | 398/115 |
| 2012/0106579 A1* | 5/2012 | Roos et al. | 372/20 |

OTHER PUBLICATIONS

Nauwelaers et al., Millimeter Wave Antennas, Circuits and Systems in MCM-D Technology, ISBN 978-94/6018-058-3, Apr. 2009.

Carpentieri et al., Millimeter-Wave Phased-Array Antennas, 1-4244-1539-X/08, 2008.

Pupil Plane Array Based Millimeter-Wave Imaging Radiometer, AFRL-IF-RS-TR-2004-95, Final Technical Report, Apr. 2004.

Clark et al., A Real-time Wide field of View Passive Millimeter-wave Imaging Camera, Proceedings of the 32nd Applied Imagery Pattern Recognition Workshop (AIPR'03), 2003.

Chih-Chieh Cheng et al., Study of 2-bit Antenna—Filter—Antenna Elements for Reconfigurable Millimeter-Wave Lens Arrays, IEEE Transactions on Microwave Theory and Techniques, vol. 54, No. 12, Dec. 2006.

Lovberg et al., Video-Rate Passive Millimeter-Wave Imaging Using Phased Arrays, IEEE 1-4244-0688-9/07 (2007).

Martin et al., Advances in Millimeter-Wave Imaging Technology for Enhanced Vision Systems, IEEE 0-7803-7367-7/02 (2002).

* cited by examiner

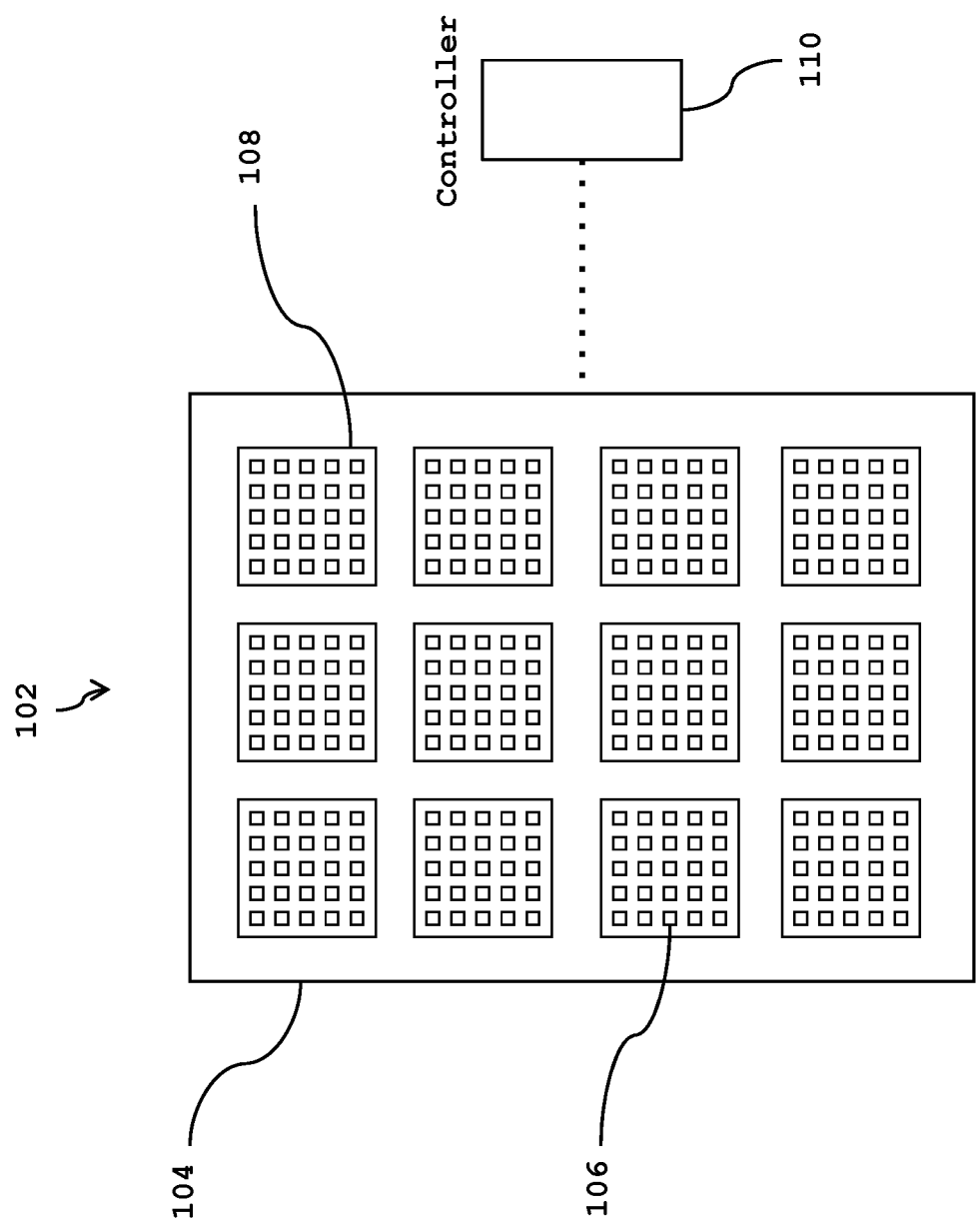

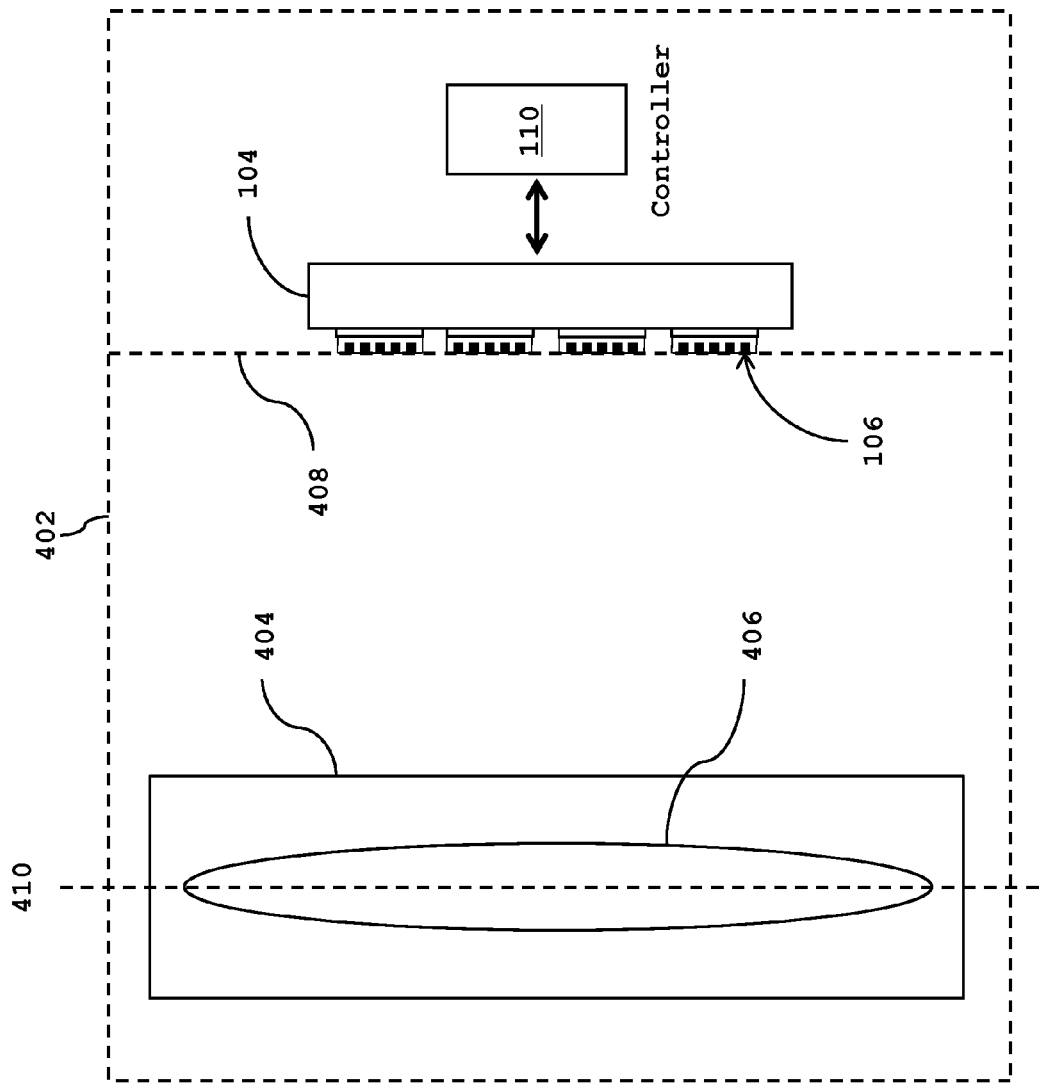
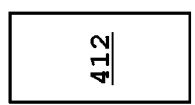
Figure 4

PHASED ARRAY MILLIMETER WAVE IMAGING TECHNIQUES

CROSS-REFERENCE TO RELATED APPLICATIONS

This application claims priority under 35 U.S.C. §120 to U.S. Provisional Patent Application No. 61/325,894 filed on Apr. 20, 2010, the entire text of which is specifically incorporated by reference herein.

BACKGROUND

This invention involves the application of phased array techniques to millimeter wave imaging. Specifically, the invention involves focal plane and pupil plane array imaging techniques using reconfigurable phased antenna arrays.

Millimeter-wave imaging involves passive detection of naturally occurring radiation in the millimeter wave (30-300 GHz) band. There are also active millimeter wave imaging systems, which illuminate the target with millimeter wave radiation. The techniques described here are also applicable to the receiver portion of active imagers. However, passive imagers have the advantage of no millimeter wave emissions, making their use difficult to detect and eliminating perceived health issues with millimeter wave radio emissions.

Atmospheric propagation windows for millimeter wave radiation (in which there is minimal atmospheric absorption of the radiation) exist at 35, 94, 140, 220 GHz, and thus, many millimeter wave imagers are designed to operate at these frequencies. However, imagers are also designed to operate at other frequencies, particularly in cases where detection of radiation is required only over relatively short distances (e.g., 10 m). Millimeter wave imagers are able to image in low-visibility conditions (as opposed to visual/infrared imagers), and millimeter wave imagers are particularly useful for imaging objects through fog or dust. They are also useful in security applications because they have ability to detect objects through clothing.

Millimeter wave imagers are most typically built using a system of millimeter wave lenses to focus millimeter wave radiation on one or more detectors. The detectors often consist of millimeter wave radio receivers and antenna elements. An image of many pixels can be created by mechanically scanning radiation from different portions of the scene sequentially onto a single detector element. Alternatively, there may be multiple detectors, arranged as a linear array or as a focal plane array. Using multiple detectors increases the dwell time of a particular detector on a single pixel of the scene. This increased integration time reduces the effective noise floor of the detector and improves the thermal resolution of the imager.

BRIEF SUMMARY

An example embodiment of the present invention is an apparatus to detect a radio frequency image. The apparatus includes an array of radio frequency antennas carried by one or more packaged integrated circuit. The apparatus also includes a controller configured to selectively phase shift radio frequency signals from the antennas such that the at least a portion of the radio frequency image is focused.

Another example of the invention is an imager element in an imager array for detecting a focused radio frequency signal from a radio frequency lens. The imager element includes a radio frequency antenna configured to receive the focused radio frequency signal. The imager element also includes a phase shifter configured to phase shift the radio frequency signal such that at least a part of the imager array is electronically steered when the radio frequency signal is combined with other radio frequency signals detected by other imager elements in the imager array. The imager element further includes a pixel detector circuit configured to pass the radio frequency signal to an imager without combining the radio signal with the other radio signals. The imager element also includes a radio frequency switch, which is configurable to divert the radio frequency signal to one of the phase shifter and the pixel detector.

Yet another example embodiment of the present invention is an imager element in an imager array. The imager element includes a radio frequency antenna positioned at a pupil plane and configured to receive a radio frequency signal. The imager element also includes a phase shifter configured to phase shift the radio frequency signal such the imager array is electronically steered when the radio frequency signal is combined with other radio frequency signals detected by other imager elements in the imager array. Moreover, the other imager elements are physically isolated from the imager element at the pupil plane. The imager element further includes a common local oscillator signal for maintaining phase coherence with the imager element and the other imager elements in the imager array.

Yet a further example embodiment of the invention is a method for imaging a radio frequency signal. The method includes receiving a focused radio frequency signal from a radio frequency antenna, which belongs to an array of antennas. The method further includes switching the radio frequency signal from a pixel detector circuit to a phase shifter circuit. The pixel detector circuit is configured to pass the radio frequency signal to an imager without combining the radio signal with the other radio signals. The phase shifter circuit is configured to phase shift the radio frequency signal such that at least a part of the array of antennas is electronically steered. This steering occurs when the radio frequency signal is combined with other radio frequency signals detected by other antennas in the array of antennas.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 shows an example apparatus contemplated by the present invention for detecting a radio frequency image.

FIG. 4 shows a side view of an example embodiment of an apparatus configured as a focal plane array imager.

DETAILED DESCRIPTION

Figure 2B:
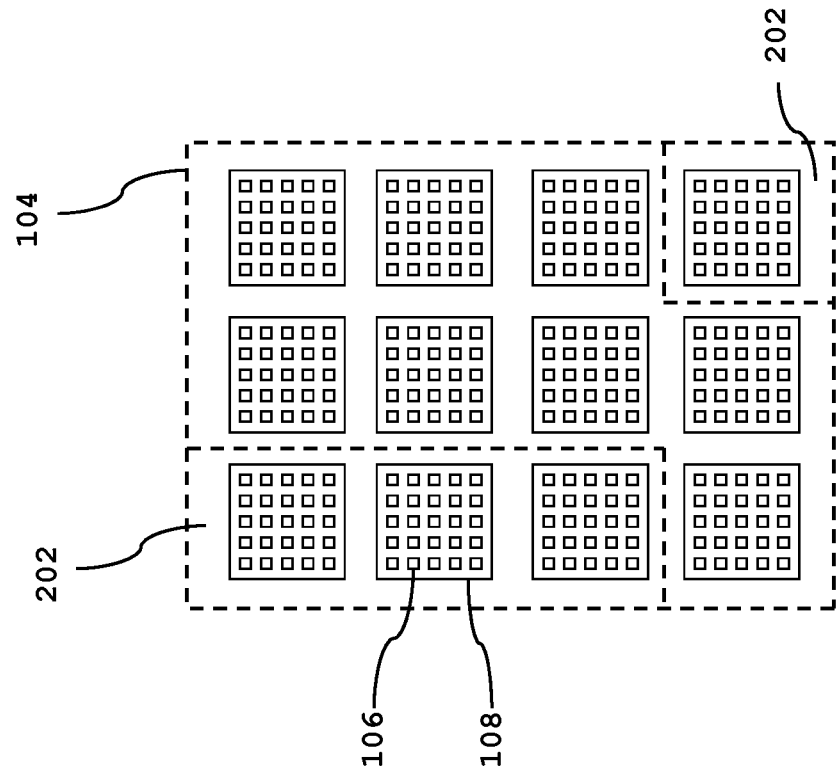
FIG. 2B shows an example grouping of the antennas as phased arrays.

The present invention is described with reference to embodiments of the invention. Throughout the description of the invention reference is made to FIGS. 1-12.

As discussed in detail below, embodiments of the present invention include a dynamically reconfigurable set of antenna arrays that allow electronic steering using phase array techniques to detect radio wave images. Embodiments may be configured to detect radio frequencies at the focal plane of a lens or a at the pupil plane without a lens.

FIG. 1 shows an example apparatus 102 contemplated by the present invention for detecting a radio frequency image. The apparatus includes an array 104 of radio frequency antennas 106 fabricated on one or more packaged integrated circuits 108 and a controller 110 configured to selectively phase shift radio frequency signals from the antennas so that a portion of the RF image is focused.

Figure 2A:
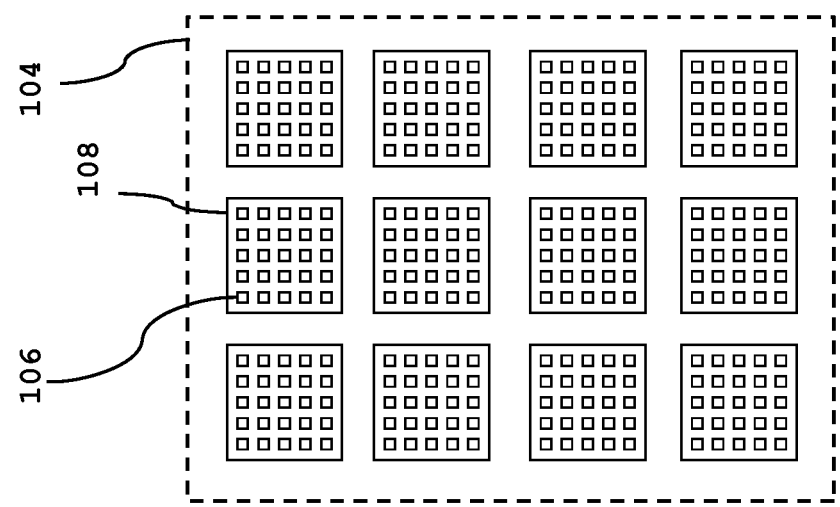
FIG. 2A shows radio frequency antennas configured without being grouped into phased arrays.

FIGS. 2A and 2B show the antennas 106 from an example apparatus grouped differently to form selected antenna array configurations. FIG. 2A shows all the antennas 106 in the array 104 arranged as individual pixels. Thus, detected radio frequency signals from antennas 106 in this arrangement are not phase-shifted as a group or combined with other radio frequency signals detected by other antennas in the array 104.

FIG. 2B shows an example of the antennas 106 configured as groups of phased arrays 202. In this embodiment, each phased array 202 consists of multiple antennas 106 on one or more packaged integrated circuits 108. Furthermore, each phased array 202 corresponds to an individual pixel in the image detected. In this matter, as detailed below, radio frequency signals from the antennas 106 can be selectively phase shifted such that the at least a portion of the radio frequency image is focused. It is contemplated that the antennas 106 can be grouped across multiple packaged integrated circuits 108 and/or across a subset of antennas 106 in a single packaged integrated circuit 108.

As mentioned, each of the antennas 106 can be configured as individual pixels or as part of a phased array 202. The greatest numbers of simultaneous pixels (i.e., greatest spatial resolution) in the scene is achieved when each antenna 106 is configured as a single pixel. Reduced noise and therefore, improved thermal resolution is achieved when the antennas 106 are configured as phased arrays 202 because the array gain improves the signal-to-noise ratio as: SNR Array gain=10 log 10(N). Different parts of the scene may have different numbers of pixels, video rates, and thermal resolutions. Furthermore, the phased arrays 202 can be used for electronic focusing. Those of ordinary skill in the art will recognize a wide range of ways to group the antennas into phased arrays.

Figure 3:
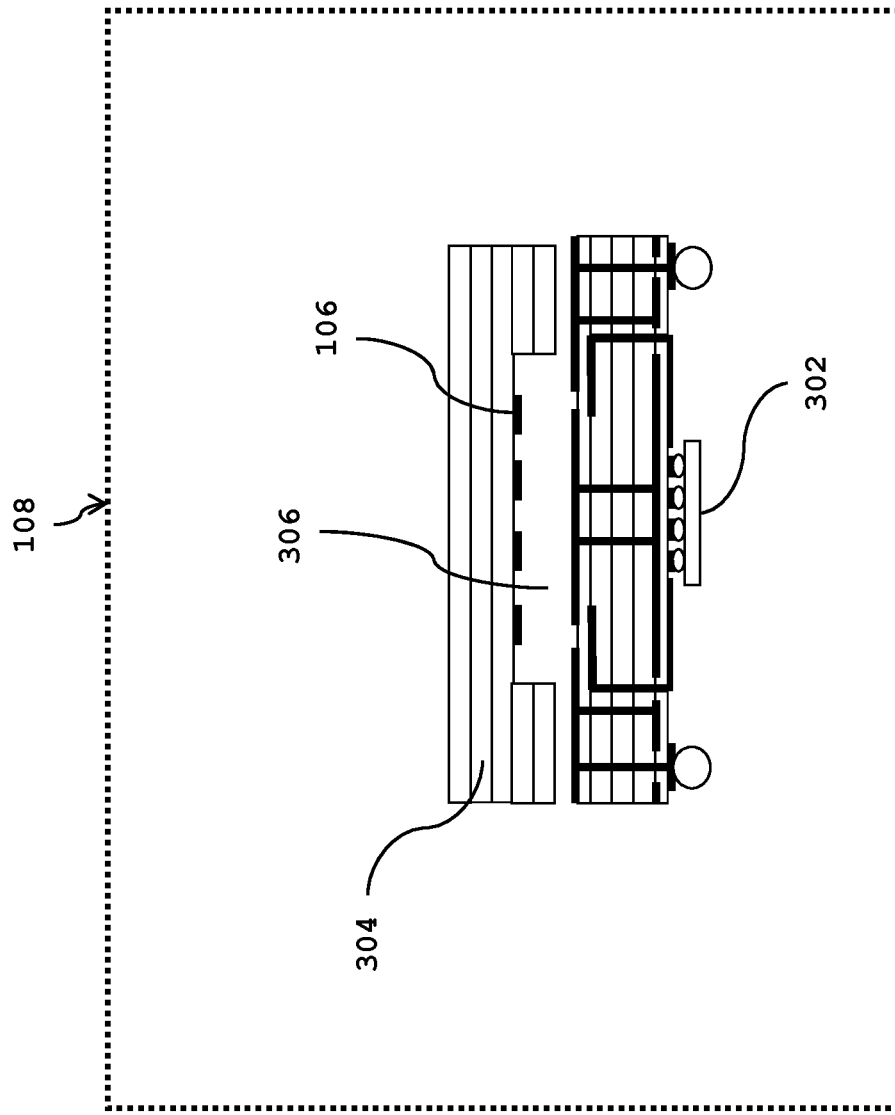
FIG. 3 shows a cross-sectional side view of an example embodiment of a packaged integrated circuit.

FIG. 3 shows a cross-sectional side view of an example embodiment of a packaged integrated circuit 108 contemplated by the present invention. A packaged integrated circuit 108 may include multiple antennas 106, as well as an integrated circuit die 302. In one embodiment, the antennas 106 may be fabricated within the package layers 304, but in other embodiments the antennas 106 may be part of an integrated circuit die 302. In one embodiment designed to detect waves with frequencies of 60 GHz, the packaged integrated circuit 108 may be fabricated with low-temperature co-fired ceramic technology with an antenna cavity 306 and a 4×4 antenna array. These sixteen patch antennas 106 might each range from 5-7 dBi gain. The antenna cavity 306 may provide an antenna environment with relative permittivity close to one, which may yields a wide (~10%) frequency bandwidth needed for an imager application. The antenna array size could be extended to 6×6, 8×8, or possibly larger arrays. In FIG. 3, the light lines delineate laminations within the package, and the dark lines indicate internal package wiring. The size of the array that can be contained within the packaged integrated circuit 108 may be limited by the path lengths from the antennas 106 to the integrated circuit die 302 and also by the number of inputs and outputs on the integrated circuit die 302.

FIG. 4 shows a side view of an example embodiment of an apparatus to detect a radio frequency image configured as a focal plane array imager 402. The example focal plane array imager includes a lens assembly 404 with at least one fixed lens 406 and an object to be imaged 412. In this embodiment, an array 104 of antennas 106 may be positioned at the focal plane 408 of the lens assembly 404. The lens assembly 404 may mechanically adjust the lens 406 to focus the radio waves to a particular array 104 of antennas 106. In other embodiments, the lens assembly 404 may focus the radio waves by moving a mirror. Thus, embodiment of the present invention may use a variety of methods for adjusting and focusing the radio waves, as would be recognized by those skilled in the art.

The lens assembly 404 may require a lens diameter determined by the Raleigh criterion. The spatial resolution of any imager (at any frequency) is limited by the Raleigh criterion. The Raleigh criterion relates the imager resolution to the wavelength of the radiation detected and the aperture diameter, i.e., the diameter of the lens in this figure. For example, to achieve a four milliradian angular resolution at 94 GHz requires approximately a one meter aperture. The limitations of optical lenses also make it difficult to produce an undistorted image with a standoff less than the lens diameter. Thus, a 94 GHz imager with a four milliradian angular resolution requires an approximate minimum volume of one cubic meter for a lens based imaging system, if implemented using conventional optics.

The use of phased-array techniques to create a reconfigurable focal plane array can allow the thermal sensitivity, video rate, and spatial resolution of the imager to be rapidly traded off against each other, as fast as the phased-array can be electronically steered and much faster than a conventional lens system can be mechanically scanned or refocused. Although the embodiment may include a bulky lens system, those of ordinary skill in the art will recognize that it may be the preferred embodiment in certain applications. These applications include embodiments in which size, weight, and volume are not significant drawbacks. One such embodiment may be a fixed-portal security imager.

Figure 5:
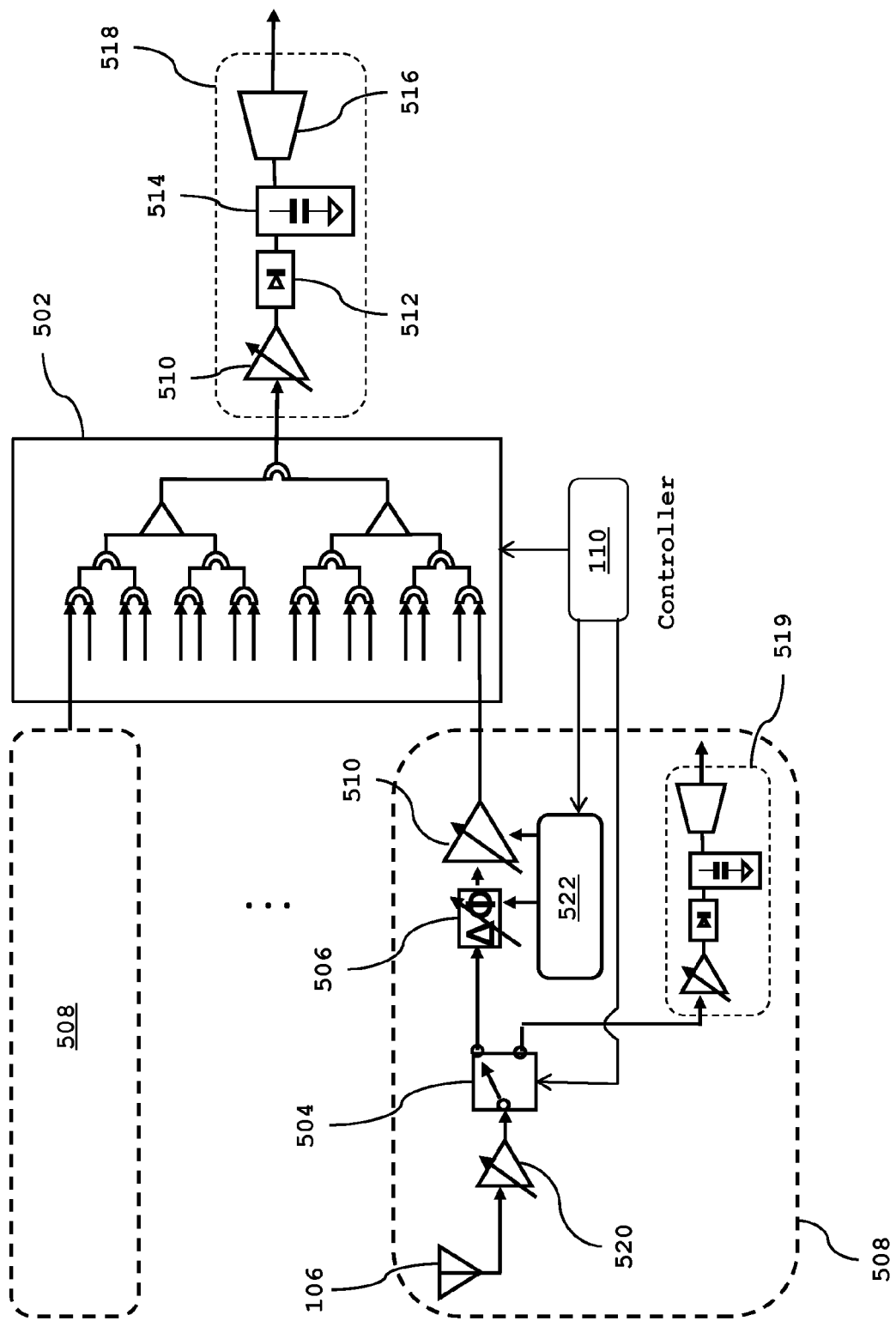
FIG. 5 shows a more detailed view of an example embodiment of an apparatus configured as a focal plane array imager.

FIG. 5 shows a more detailed view of an example embodiment of an apparatus 102 configured as a focal plane array imager 402. The embodiment includes a power combiner 502 configured to combine the radio frequency signals from the antennas 106. The embodiment also includes a plurality of radio frequency switches 504. Each radio frequency switch 504 is coupled to a respective one of the radio frequency antennas 106. In this manner, the signal from each antenna 106 can be individually imaged, or combined with other radio frequency signals from the antennas 106 by the power combiner 502. The embodiment further includes a phase shifter 506 coupled to the power combiner 502 for each antenna 106. An individual antenna 106, radio frequency switch 504, and phase shifter 506 may be referred to as being part of an imager element 508

The power combiner 502 may include a four-stage binary RF power-combining tree, as described by S. Reynolds et al., "A 16-Element Phased-Array Receiver IC for 60-GHz Communications in SiGe BiCMOS," 2010 RFIC Symposium Digest of Papers, incorporated herein by reference in its entirety. Those of ordinary skill in the art will recognize a variety of power combining methods applicable to the contemplated invention. Following the power combiner 502, the signal may pass through a variable gain amplifier 510 followed by an envelope detector 512. The output of the envelope detector may pass through an integrator 514 and then be digitized by an analog-to-digital converter 516 prior to digital signal processing. These four elements and similar embodiments may be referred to as a pixel detector circuit 518 and 519. In one embodiment, the pixel detector circuit 518 and 519 may have a mixed-signal/digital implementation consisting of an ADC and the other functions (VGA, integration) in the digital domain.

The example embodiment of FIG. 5 may be configured so that an array of radio frequency antennas 106 is selectively configured to be electronically steered by the controller 108. Electronic steering may consist of, but is not limited to, focusing the direction of detected radio waves through phase shifting and grouping antennas as phased arrays to increase thermal resolution on portions of the image. An example embodiment of FIG. 5 may also use antennas 106 that are configured to detect electromagnetic waves in the millimeter wave band (approximately 30-300 GHz). These antennas 106 may be fabricated on silicon in the same or similar manner to those described above. The example embodiment of FIG. 5 may also include a low-noise amplifier 520, variable-gain amplifier 510, and digital beam lookup table 522, as further described below.

Figure 6:
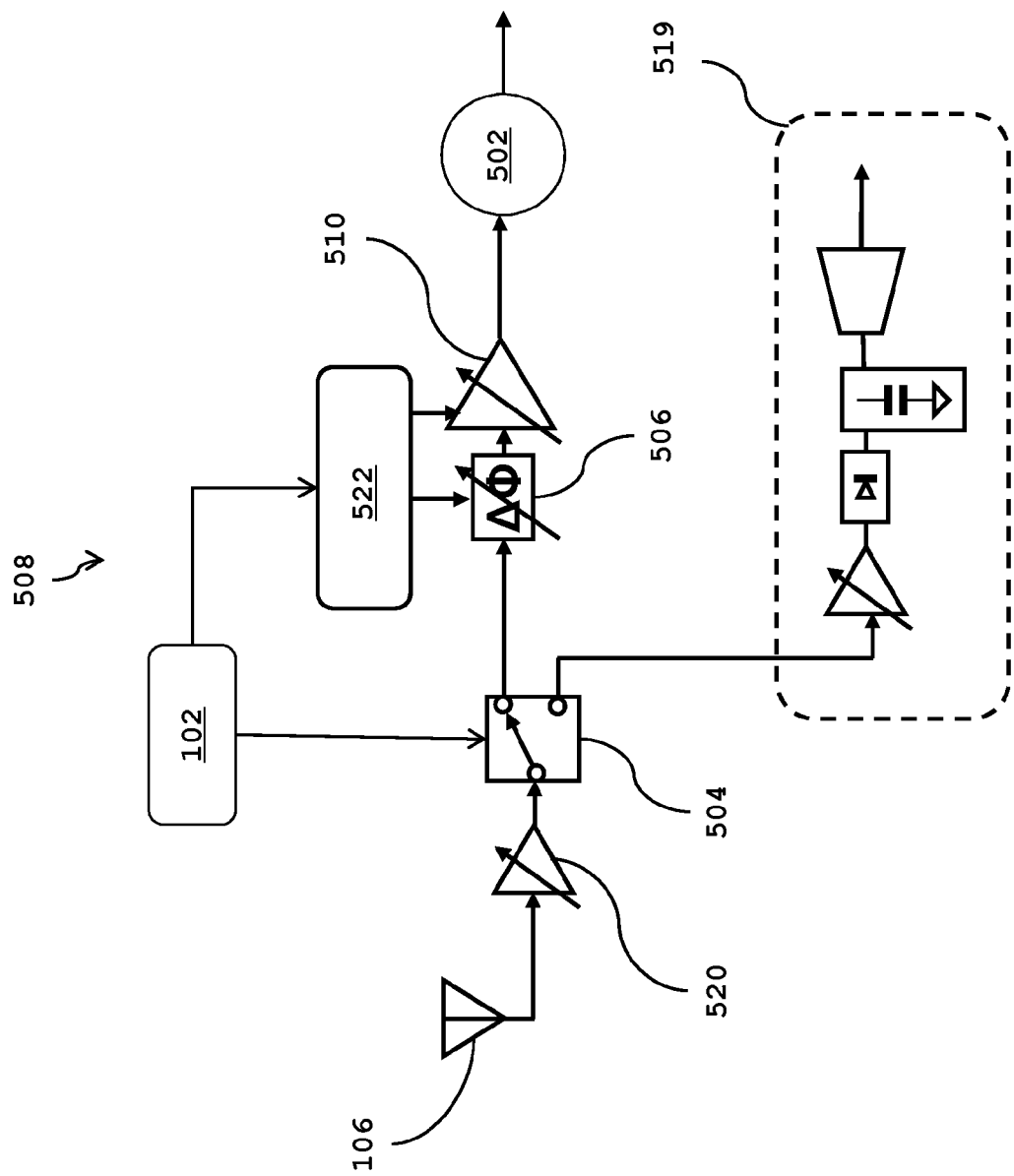
FIG. 6 shows an example embodiment of an imager element in an imager array for detecting a focused radio frequency signal from a radio frequency lens.

FIG. 6 shows an example embodiment of an imager element 508 in an imager array 104 (see FIG. 1) for detecting a focused radio frequency signal from a radio frequency lens 406. The imager element 508 may include a radio frequency antenna 106 configured to receive the focused radio frequency signal. An embodiment may include a phase shifter 506 configured to phase shift the radio frequency signal. The phase may be shifted such that at least a part of the imager array 104 is electronically steered when the radio frequency signal is combined with other radio frequency signals detected by other imager elements 508 in the imager array 104.

An embodiment of FIG. 6 further includes a first pixel detector circuit 519 configured to pass the radio frequency signal to an imager without combining the radio signal with the other radio signals. An embodiment may also include a radio frequency switch 504, which is configurable to divert the radio frequency signal to either the phase shifter 506 or the first pixel detector circuit 519. In different embodiments, the switch implementation could be passive or active, and may include, for example, an amplifier with switchable cascode loads. Although not shown here, those skilled in the art will recognize that Dicke switching or similar methods known in the art may be incorporated into an embodiment of the imager element to reduce the effect of detector gain variations.

In an embodiment of the imager element 508, the signal detected by the antenna 106 may pass through a low-noise amplifier 520 and then through a radio frequency switch (or power divider) 504 that passes the signal to either the phase shifter 506 or the first pixel detector circuit 519. In another embodiment, a power divider 504 may pass a portion of the signal to each path. If passed to the phase shifter 506, the signal passes through a phase shifter 506. In one embodiment the phase shifter 506 may include a reflection-type phase shifter or an active phase shifter as described in "60-GHz Passive and Active RF Phase Shifters in Silicon" M. D. Tsai and A. Natarajan (IBM), RFIC 2009, pp. 223-226, incorporated herein by reference. After passing through the phase shifter 506, the signal may then pass to a variable-gain amplifier 510. Following the variable-gain amplifier 510, the signals detected from multiple RF antennas may be power-combined according to the methods described above.

An embodiment of the imager element 508 may further include a digital beam lookup table 522 configured to determine a degree shift necessary by the phase shifter 506 such that the imager array 104 is electronically steered to a desired angle. Once the combined radio frequency signal is output from the power combiner 502, it is passed to a second pixel detector circuit 518. The second pixel detector circuit 518 is coupled to the power combiner and is configured to pass the power combined radio frequency signal to the imager.

Figure 7:
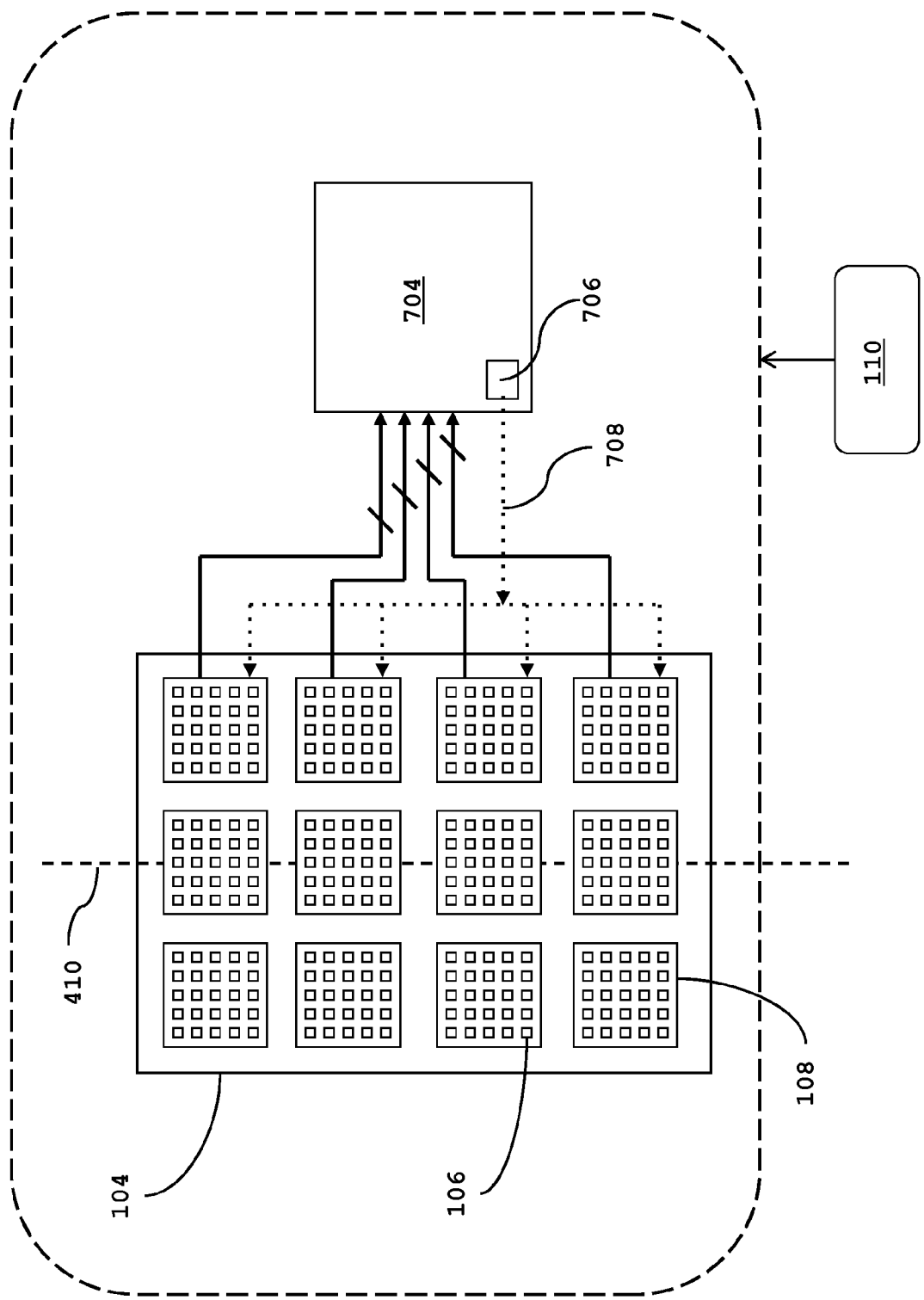
FIG. 7 shows an example embodiment of an apparatus configured as a pupil plane array imager.

FIG. 7 shows an example embodiment of an apparatus to detect a radio frequency image where the antennas 106 are positioned at a pupil plane 410 of the image to be detected. The apparatus may include an array 104 of radio frequency antennas 106 fabricated on one or more packaged integrated circuits 108 and a controller 110 configured to selectively phase shift radio frequency signals from the antennas 106 so that a portion of the RF image is focused. The example embodiment may also include a phase shifter for each antenna 106, and one or more power combiners for combining phase-shifted radio frequencies, as later described and shown as in FIG. 8.

The apparatus may also include one or more packaged integrated circuits 108 and at least one combiner circuit 704 whose functionality is described below. In one embodiment, each array of packaged integrated circuits is fabricated along with a corresponding combiner circuit 704. In an embodiment, the apparatus may also include a local oscillator 706 used to maintain phase coherence between the radio frequency signals detected by the radio frequency antennas 106. This local oscillator 706 may produce a local oscillator signal 708 that is distributed from the combiner circuit 704 to each of the packaged integrated circuits 108. In the case of multiple combiner circuits, a single local oscillator signal may be distributed throughout all packaged integrated circuits 108. Although FIG. 7 only shows arrows pointing to and from four packaged integrated circuits 108, it should be noted that arrows and the corresponding circuitry they represent may exist for each packaged integrated circuit 108.

An embodiment configured at the pupil plane 410 may use phased-array techniques to produce a pupil-plane array, eliminating the need for optical lenses. The array of packaged integrated circuits 108 is placed at the pupil plane 410 of the imager, rather than at the focal plane of an optical lens, with the overall outer dimensions of the array forming the aperture of the imager (rather than having the optical lens size determining the aperture). Signal processing reconstructs an image from the information collected at the pupil plane 410.

All of the antennas 106 may be used together as a phased array 104 or as multiple phased-arrays 104 organized, for example, by columns. In either case, phase coherence needs to be maintained between the individual elements despite the fact that the antennas 106 are implemented on different packaged integrated circuits 108. In one embodiment, the signals from multiple antennas 106 are phase-shifted, power-combined, and down-converted to an intermediate frequency ("IF") signal for distribution at the printed circuit board level. The down-conversion uses a local oscillator signal 708, which is common to all packaged integrated circuits 108 and is distributed at the board level. Each packaged integrated circuit 108 may allow the signals from the antennas 106 to be processed by column, each column consisting of one or more columns of antennas 106. There would then be an IF output signal for each column. The combiner circuit 704 would combine the IF signals by column with a phase shifter 506 in each IF signal path to allow compensation for different phase shifts in the wiring for each IF signal path.

The pupil plane array 104 of FIG. 7 may consist of a K×L array 104 of packaged integrated circuits 108, with K packaged integrated circuits 108 in the x-direction and L packaged integrated circuits 108 in the y-direction (K≧1 and L≧1). Each packaged integrated circuit 108, in turn, could consist of an N×M array 104 of antennas 106. The packaged integrated circuit 108 would contain a total of N×M radio frequency antennas 106 (N≧1 and M≧1). If processing the signals by column, then the packaged integrated circuit 108 may have M IF outputs. The packaged integrated circuit 108 would contain N×M antennas 106 connected to the RF inputs of the packaged integrated circuit 108. The combiner circuit 704 would combine the IF outputs of the packaged integrated circuits 108. In this example embodiment, the combiner circuit 704 would have K×L×M IF inputs. The combiner circuit 704 might be implemented on multiple packaged ICs if the number of inputs grows too large. The combiner circuit 704 may also produce the local oscillator signal 708 that is distributed to each packaged integrated circuit 108.

Figure 8:
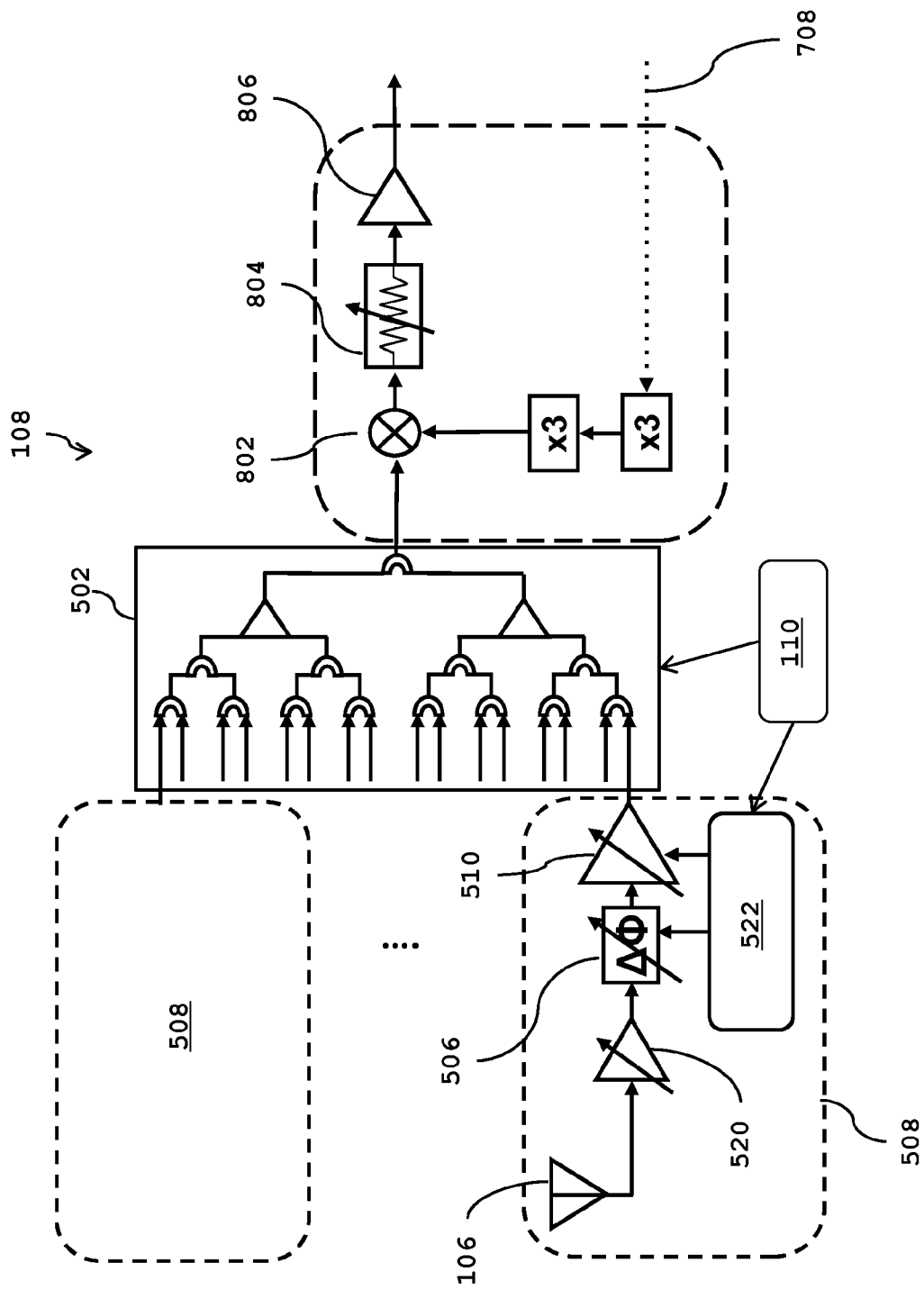
FIG. 8 shows in detail a circuit view of an example embodiment of a packaged integrated circuit that may be used as part of a pupil plane array imager.

FIG. 8 shows in detail a circuit view of an example embodiment of a packaged integrated circuit 108. An example embodiment of a packaged integrated circuit 108 configured for use at the pupil plane 410 may include a phase shifter 506 for each antenna 106 and one or more power combiners 502 for combining phase-shifted radio frequencies. The antennas 106 may be similar to those described above, fabricated within a packaged integrated circuit 108. In one embodiment, the antennas 106 may be fabricated within a the package layers 304, but in other embodiments the antennas 106 may be part of an integrated circuit die 302. The antennas 106 may also be configured to detect electromagnetic waves in the 30-300 GHz radio frequency band.

An example embodiment of a packaged integrated circuit 108 configured for use at the pupil plane may include N radio frequency antennas 106 and one output, but a different embodiment may have N×M RF antennas 106 and M IF outputs. Each antenna 106 is coupled with a phase shifter 506. Beam forming is accomplished by adjusting the phase and gain of each signal detected by the antennas 106. An individual antenna 106 and phase shifter 506 may be described as part of an imager element 508, which may also include a low-noise amplifier 520, digital beam lookup table 522, and variable-gain amplifier 510.

Following the imager element 508 may be a power combiner (also referred to as a power-combining tree) 502 in which the N signal paths are combined. Following the power combiner 502, the signal may be frequency-converted (mixed) to an IF frequency though a frequency mixer 802, then it may pass through a variable attenuator 804 and amplifier 806 to adjust the amplitude of the IF signal. In an embodiment, the local oscillator signal 708 may be distributed at the board level and may be an input to the packaged integrated circuit 108, where it may be multiplied in frequency (by nine times in FIG. 8) and used as the mixer's oscillator input. The local oscillator signal 708 may be distributed at a lower frequency to avoid problems associated with having a full-rate local oscillator signal 708 routed on the board (such as attenuation and coupling), but in other embodiments this may not be advantageous.

Figure 9:
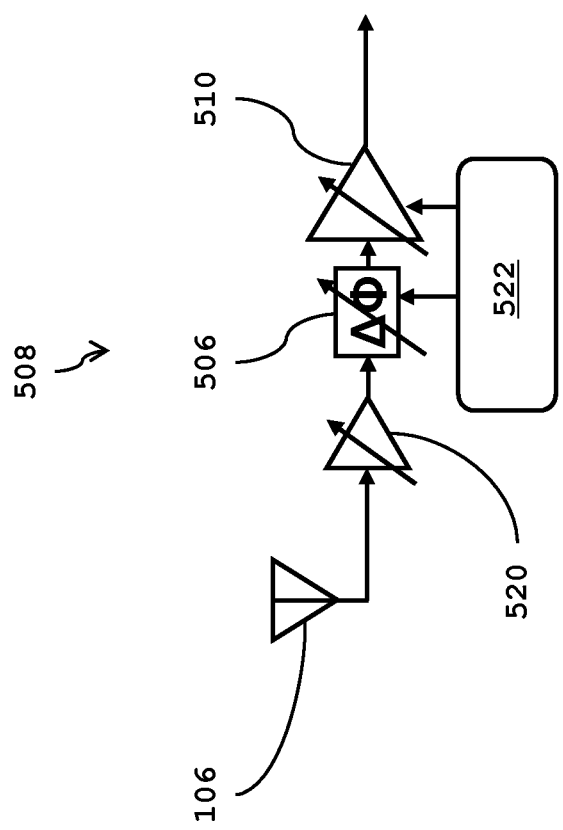
FIG. 9 shows an example embodiment of an imager element that may be used as part of a pupil plane array imager.

FIG. 9 shows embodiment of an imager element 508 in an imager array 104. An embodiment may include a radio frequency antenna 106 positioned at a pupil plane and configured to receive a radio frequency signal. This embodiment may also include a phase shifter 506 configured to phase shift the radio frequency signal. The phase may be shifted such that the imager array 104 is electronically steered when the radio frequency signal is combined with other radio frequency signals detected by other imager elements in the imager array 104. The other imager elements 508 may be physically isolated from the imager element 508 at the pupil plane. An embodiment may further include a common local oscillator signal for maintaining phase coherence with the imager element 508 and the other imager elements 508 in the imager array 104.

An embodiment of an imager element 508 for a pupil plane array may also include an amplifier 520 and a variable-gain amplifier 510. An embodiment of the imager element 508 may also include a digital beam lookup table 522 configured to determine a degree shift necessary by the phase shifter 506 such that the imager array is electronically steered to a desired angle. The imager element 508 may also be fabricated as part of a packaged integrated circuit 108 configured to power combine the radio frequency signal with the other radio frequency signals into a power combined radio frequency signal. In another embodiment, the imager element 508 may be fabricated separately from the packaged integrated circuit 108. Although not shown, those skilled in the art will recognize that Dicke switching or similar methods may be incorporated into an embodiment of the imager element 508 to reduce the effect of detector gain variations.

Figure 10:
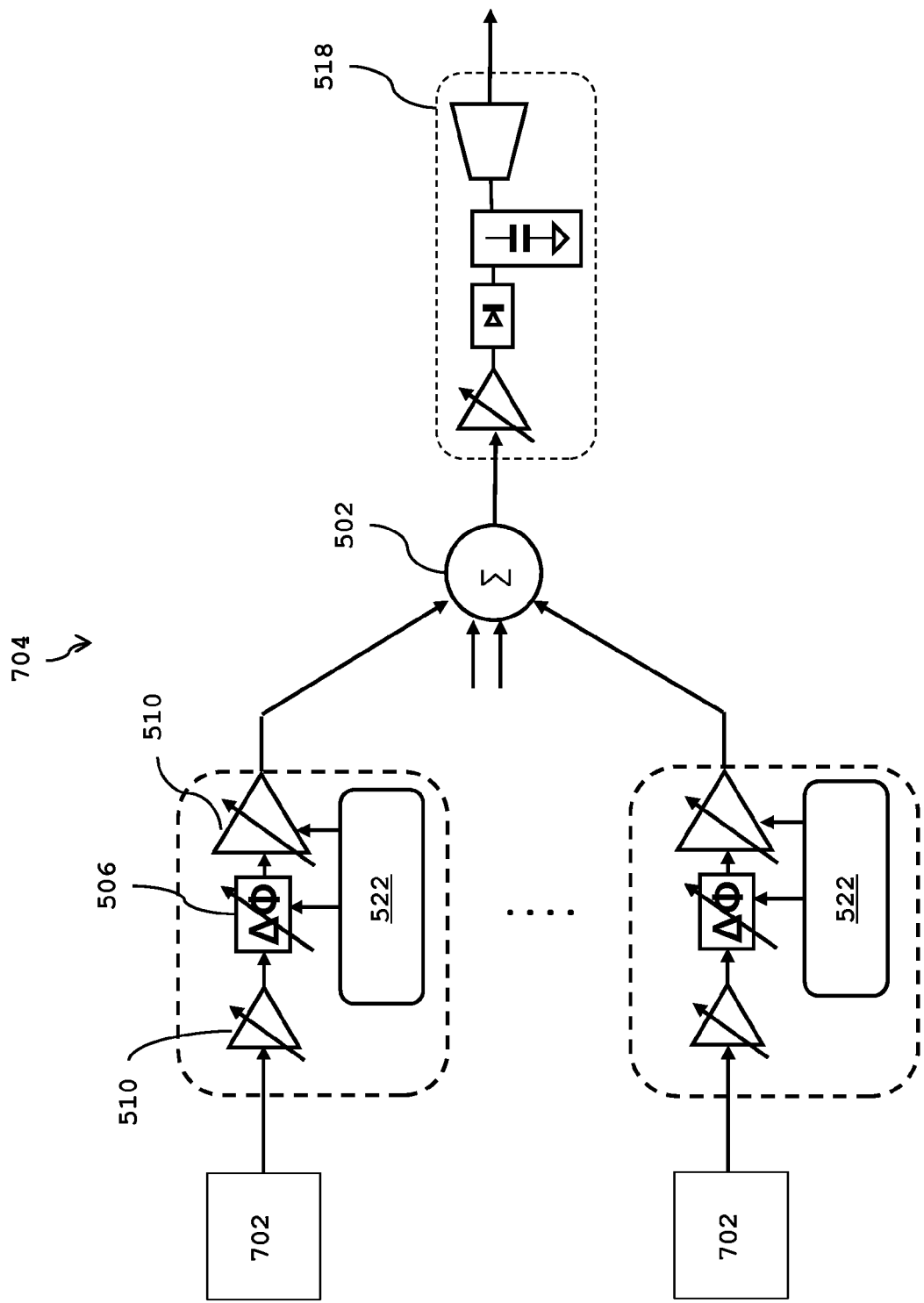
FIG. 10 shows an example embodiment of a combiner circuit that may be used as part of a pupil plane array imager.

FIG. 10 shows an example embodiment of a combiner circuit 704. The combiner circuit 704 may, for example, combine by column the IF signals from the packaged integrated circuits 108, with a phase shifter 506 in each IF signal path to allow compensation for different phase shifts in the wiring for each IF signal path. The combiner circuit(s) 704 may have a total number of inputs equal to M times the number of packaged integrated circuits 108. The combiner circuit 704 may have multiple outputs, equal at least to the number of columns being processed.

In an example embodiment of the combiner circuit 704, each of the IF input signals may pass through a combination of variable-gain amplifiers 510 and a phase shifter 506 with an accompanying digital beam lookup table 522. The multiple signals may then be power-combined through a power combiner 502. Those of ordinary skill in the art will recognize that the power combiner 502 and phase shifter 506 used here may be different than those used in the packaged integrated circuits 108, depending on the frequency of the signal. After power combining, the signal passes through another variable-gain amplifier 510 prior to envelope detection. The output of the envelope detector may be integrated and digitized prior to digital signal processing as described above through a pixel detector circuit 518.

The packaged integrated circuits 108 and combiner circuits 704 are shown as separate devices, which would be connected at the board or package level, but in certain applications, their functions may be combined onto a single IC. Furthermore, the frequencies given for the RF, IF, and local oscillator signals 708 are based on a typical 94-GHz imaging system, but the frequencies may be different depending on the application. Although the pupil-plane array imager is still limited by the Raleigh criterion, the elimination of the optical lens system eliminates the need for a standoff equal to the lens diameter.

Figure 11:
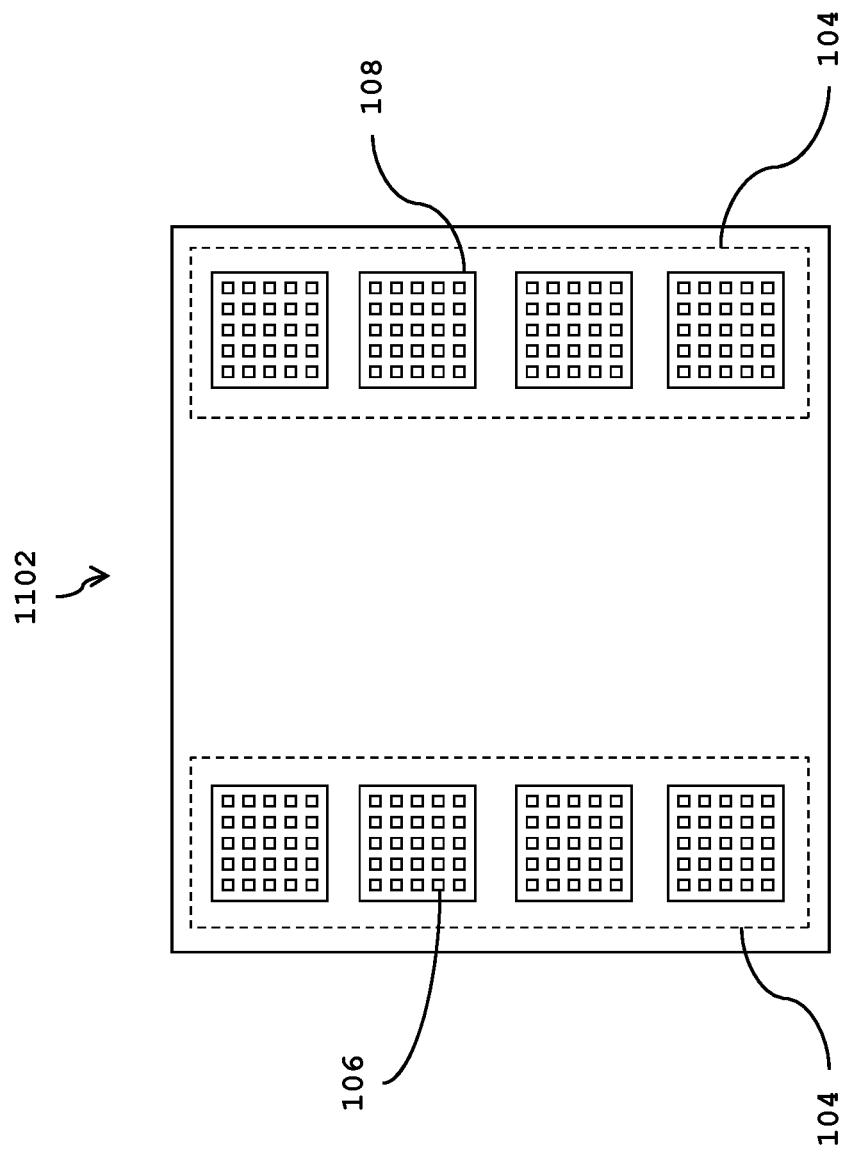
FIG. 11 shows an example embodiment of an apparatus where a pupil plane configuration may be implemented as a sparsely filled array.

FIG. 11 shows an example embodiment of an apparatus where a pupil plane configuration may be implemented as a sparsely filled array 1102. A sparsely filled array 1102 is an array with less than all of its elements filled. In one embodiment, the array of radio frequency antennas 106 may include antennas 106 placed at two or more points on a uniform grid such that the array 104 is implemented as a sparsely filled array. In an embodiment, the array 104 of radio frequency antennas 106 may include a first antenna array 104 and a second antenna array 104. The first antenna array and the second antenna array may be spaced at substantially opposite ends of the pupil plane. In another embodiment, the sparsely filled array 1102 could be implemented by arranging the packaged integrated circuits 108 with antennas 106 in two columns at opposite edges of the sparsely filled array 1102, along with several columns placed in the interior of the sparsely filled array 1102. Thus, a one meter by one meter sparsely filled array 1102 could consist of several columns of packaged integrated circuits 108, each one meter high and a few centimeters wide, with the outermost two columns separated by one meter but much of the interior of the array unpopulated. Phase coherence among the antennas 106 may be maintained using the architecture of the pupil plane embodiments described above.

Figure 12:
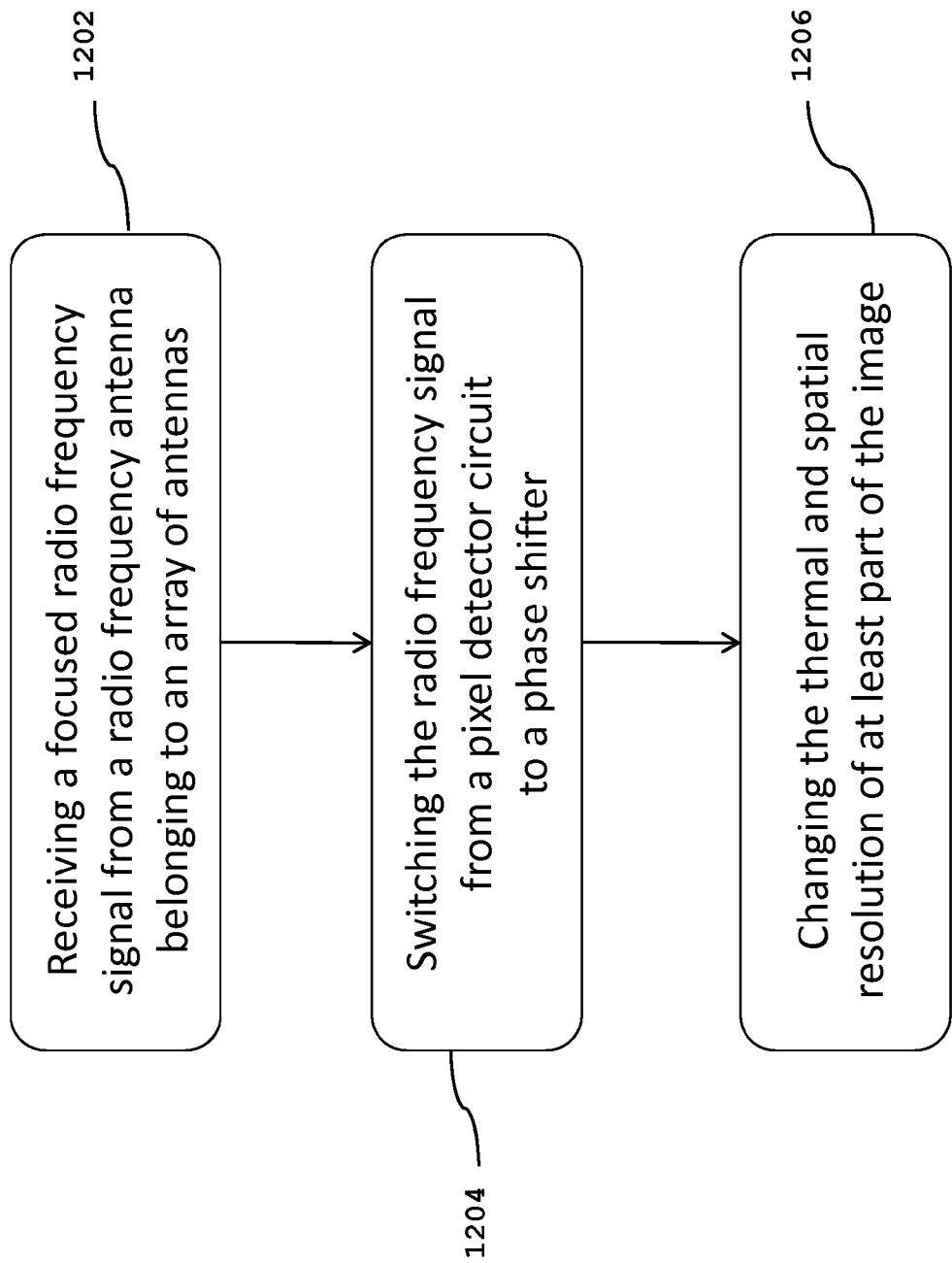
FIG. 12 shows an example embodiment of a method for imaging a radio frequency signal.

FIG. 12 shows an example embodiment of a method for imaging a radio frequency signal. The method may include receiving operation 1202 which receives a focused radio frequency signal from a radio frequency antenna 106 belonging to an array 104 of antennas 106. The method may also include a switching operation 1204 to switch the radio frequency signal from a pixel detector circuit 518 to a phase shifter 506. The pixel detector circuit 518 may be configured to pass the radio frequency signal to an imager without combining the radio signal with the other radio signals. The phase shifter 506 may be configured to phase shift the radio frequency signal such that at least a part of the array 104 of antennas 106 is electronically steered. This electronic steering may occur when the radio frequency signal is combined with other radio frequency signals detected by other antennas 106 in the array 104 of antennas 106. The method may further include a changing operation 1206 for adjusting the thermal and spatial resolution of at least part of the image.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. An apparatus to detect a radio frequency image, the apparatus comprising:
    an array of radio frequency antennas carried by one or more packaged integrated circuits, the array of antennas is positioned at a focal plane of the lens assembly, at least part of the array of radio frequency antennas is selectively configured to be electronically steered by the controller;
    a controller configured to selectively phase shift radio frequency signals from the antennas such that at least a portion of the radio frequency image is focused; and
    a lens assembly including at least one fixed lens.

2. The apparatus according to claim 1, further comprising:
    a power combiner configured to combine the radio frequency signals from the antennas;
    a plurality of radio frequency switches, each radio frequency switch coupled to a respective one of the radio frequency antennas, such that the signal from each antenna can be individually imaged or combined with other radio frequency signals from the antennas by the power combiner; and
    a phase shifter, for each antenna.

3. The apparatus according to claim 1, wherein the antennas are configured to detect electromagnetic waves in the millimeter wave band.

4. The apparatus according to claim 1, wherein the antennas are positioned at a pupil plane of the image to be detected.

5. The apparatus according to claim 1, wherein the antennas are carried by a silicon substrate.

6. The apparatus according to claim 1, further comprising:
    a phase shifter for each antenna; and
    one or more power combiners for combining phase-shifted radio frequency signals.

7. The apparatus according to claim 1, further comprising a local oscillator used to maintain phase coherence between the radio frequency signals detected by the radio frequency antennas.

8. The apparatus according to claim 1, wherein the array of radio frequency antennas includes antennas placed at two or more points on a uniform grid such that the array is implemented as a sparsely filled array.

9. The apparatus according to claim 1, wherein the antennas are configured to detect electromagnetic waves in the range of 30-300 GHz band.

10. An imager element in an imager array for detecting a focused radio frequency signal from a radio frequency lens, the imager element comprising:
    a radio frequency antenna configured to receive a focused radio frequency signal;
    a phase shifter configured to phase shift the radio frequency signal such that at least a part of the imager array is electronically steered when the radio frequency signal is combined with other radio frequency signals detected by other imager elements in the imager array;
    a first pixel detector circuit configured to pass the radio frequency signal to an imager without combining the radio signal with the other radio signals; and
    a radio frequency switch, the switch configurable to divert the radio frequency signal to one of the phase shifter and the pixel detector.

11. The imager element according to claim 10, further comprising a digital beam lookup table configured to determine a degree shift necessary by the phase shifter such that the imager array is electronically steered to a desired angle.

12. The imager element according to claim 10, further comprising a power combiner coupled to the phase shifter, the power combiner configured to power combine the radio frequency signal with the other radio frequency signals into a power combined radio frequency signal.

13. The imager element according to claim 12, further comprising a second pixel detector circuit coupled to the power combiner, the second pixel detector circuit configured to pass the power combined radio frequency signal to the imager.

14. An imager element in an imager array, the imager element comprising:
- a radio frequency antenna positioned at a pupil plane and configured to receive a radio frequency signal;
- a phase shifter configured to phase shift the radio frequency signal such that the imager array is electronically steered when the radio frequency signal is combined with other radio frequency signals detected by other imager elements in the imager array, the other imager elements being physically isolated from the imager element at the pupil plane; and
- a common local oscillator signal for maintaining phase coherence with the imager element and the other imager elements in the imager array.

15. The imager element according to claim 14, further comprising a digital beam lookup table for determining a degree shift necessary by the phase shifter such that the imager array is electronic steered to a desired angle.

16. The imager element according to claim 14, wherein the imager element is fabricated as part of a packaged integrated circuit configured to power combine the radio frequency signal with other radio frequency signals into a power combined radio frequency signal.

17. A method for imaging a radio frequency signal, comprising:
- receiving a focused radio frequency signal from a radio frequency antenna, the radio frequency antenna belonging to an array of antennas; and
- switching the radio frequency signal from a pixel detector circuit configured to pass the radio frequency signal to an imager without combining the radio signal with the other radio signals to a phase shifter circuit configured to phase shift the radio frequency signal such that at least a part of the array of antennas is electronically steered when the radio frequency signal is combined with other radio frequency signals detected by other antennas in the array of antennas.

18. The method of claim 17, further comprising changing the thermal and spatial resolution of at least part of the image.

* * * * *